US010833041B2

(12) United States Patent
Hwang et al.

(10) Patent No.: US 10,833,041 B2
(45) Date of Patent: Nov. 10, 2020

(54) FAN-OUT SEMICONDUCTOR PACKAGE

(71) Applicant: SAMSUNG ELECTRONICS CO., LTD., Suwon-si (KR)

(72) Inventors: Jun Oh Hwang, Suwon-si (KR); Ki Jung Sung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/828,948

(22) Filed: Dec. 1, 2017

(65) Prior Publication Data
US 2019/0035758 A1    Jan. 31, 2019

(30) Foreign Application Priority Data

Jul. 31, 2017 (KR) .......................... 10-2017-0097000

(51) Int. Cl.
*H01L 23/00* (2006.01)
*H01L 23/538* (2006.01)
(Continued)

(52) U.S. Cl.
CPC ............... *H01L 24/25* (2013.01); *H01G 4/00* (2013.01); *H01L 23/5389* (2013.01);
(Continued)

(58) Field of Classification Search
CPC ......... H01L 24/25; H01L 24/20; H01L 24/19; H01L 23/5389; H01L 24/82; H01L 24/02;
(Continued)

(56) References Cited

U.S. PATENT DOCUMENTS 5,266,739 A * 11/1993 Yamauchi ................ H01C 1/14
174/540
6,972,964 B2    12/2005 Ho et al.
(Continued)

FOREIGN PATENT DOCUMENTS

JP         04304693 A  * 10/1992
JP       2002-057066 A    2/2002
(Continued)

OTHER PUBLICATIONS

Taiwanese Office Action dated Dec. 19, 2018 issued in Taiwanese Patent Application No. 106142570 (with English translation).
(Continued)

*Primary Examiner* — Steven H Loke
*Assistant Examiner* — Juanita B Rhodes
(74) *Attorney, Agent, or Firm* — Sughrue Mion, PLLC

(57) ABSTRACT

A fan-out semiconductor package may include a support member having a through-hole, a semiconductor chip disposed in the through-hole, a component embedded structure disposed adjacent to and spaced apart from the semiconductor chip in the through-hole by a predetermined distance, an encapsulant, and a connection member. The semiconductor chip has an active surface having connection pads disposed thereon and an inactive surface opposing the active surface. The component embedded structure has a plurality of passive components embedded therein. The encapsulant encapsulates at least portions of the support member, the component embedded structure, and the semiconductor chip. The connection member is disposed on the support member, the component embedded structure, and the active surface of the semiconductor chip. The connection member includes redistribution layers and vias electrically connecting the redistribution layers to the plurality of passive components and the connection pads of the semiconductor chip.

15 Claims, 22 Drawing Sheets

(51) Int. Cl.
*H01G 4/00* (2006.01)
*H01L 23/31* (2006.01)
*H01L 21/56* (2006.01)

(52) U.S. Cl.
CPC ............. *H01L 24/02* (2013.01); *H01L 24/19* (2013.01); *H01L 24/20* (2013.01); *H01L 24/24* (2013.01); *H01L 24/82* (2013.01); *H01L 21/568* (2013.01); *H01L 23/3128* (2013.01); *H01L 24/13* (2013.01); *H01L 24/16* (2013.01); *H01L 2224/02377* (2013.01); *H01L 2224/12105* (2013.01); *H01L 2224/13024* (2013.01); *H01L 2224/16227* (2013.01); *H01L 2224/2402* (2013.01); *H01L 2224/24101* (2013.01); *H01L 2224/24155* (2013.01); *H01L 2224/24195* (2013.01); *H01L 2224/24998* (2013.01); *H01L 2224/25171* (2013.01); *H01L 2224/32225* (2013.01); *H01L 2224/73204* (2013.01); *H01L 2224/82101* (2013.01); *H01L 2224/82106* (2013.01); *H01L 2924/15311* (2013.01); *H01L 2924/181* (2013.01); *H01L 2924/19041* (2013.01); *H01L 2924/19042* (2013.01); *H01L 2924/19105* (2013.01)

(58) Field of Classification Search
CPC ............... H01L 24/24; H01L 2924/181; H01L 2924/15311; H01L 2224/82106; H01L 2224/32225; H01L 2224/16227; H01L 2224/12105; H01L 23/3128; H01L 21/568; H01L 2224/82101; H01L 2224/73204; H01L 2224/02377; H01L 24/16; H01L 24/13; H01L 2224/2402; H01L 2224/24101; H01L 2224/24195; H01L 2924/19042; H01L 2224/25171; H01L 2224/13024; H01L 2224/24998; H01L 2924/19105; H01L 2924/19041; H01L 2224/24155; H01L 2224/131; H01L 2924/3511; H01L 2924/381; H01L 23/5386; H01L 23/5383; H01L 23/5384; H01L 23/49811; H01G 4/00; H01G 4/224
See application file for complete search history.

(56) References Cited

U.S. PATENT DOCUMENTS

| | | | |
|---|---|---|---|
| 8,432,022 B1* | 4/2013 | Huemoeller | H01L 23/552 257/508 |
| 9,368,563 B2 | 6/2016 | Lin et al. | |
| 2004/0227258 A1 | 11/2004 | Nakatani | |
| 2006/0214288 A1* | 9/2006 | Ohsumi | H01L 23/5389 257/724 |
| 2008/0024998 A1 | 1/2008 | Hsu | |
| 2010/0059855 A1 | 3/2010 | Lin et al. | |
| 2010/0200975 A1 | 8/2010 | Chino | |
| 2012/0013021 A1* | 1/2012 | Kobayashi | H01L 24/19 257/774 |
| 2014/0029205 A1* | 1/2014 | Kuo | H01L 25/16 361/728 |
| 2015/0084206 A1 | 3/2015 | Lin | |
| 2015/0179570 A1* | 6/2015 | Marimuthu | H01L 25/0655 257/774 |
| 2015/0270237 A1* | 9/2015 | Chi | H01L 21/486 257/737 |
| 2016/0043047 A1* | 2/2016 | Shim | H01L 21/56 257/773 |
| 2016/0226463 A1* | 8/2016 | Watanabe | H03H 7/1758 |
| 2016/0338202 A1 | 11/2016 | Park et al. | |
| 2017/0103951 A1 | 4/2017 | Lee et al. | |
| 2017/0133309 A1 | 5/2017 | Kim et al. | |
| 2017/0213793 A1* | 7/2017 | Hurwitz | H01L 23/36 |
| 2017/0374733 A1* | 12/2017 | Itakura | H01L 23/13 |

FOREIGN PATENT DOCUMENTS

| | | | |
|---|---|---|---|
| JP | 2004-363566 A | | 12/2004 |
| JP | 2007-294828 A | | 11/2007 |
| JP | 2009-081183 A | | 4/2009 |
| JP | 2010-186847 A | | 8/2010 |
| KR | 20100049846 A | * | 5/2010 |
| KR | 10-2013-0132163 A | | 4/2013 |
| KR | 10-2016-0132763 A | | 11/2016 |

OTHER PUBLICATIONS

Office Action issued in corresponding Korean Patent Application No. 10-2017-0097000 dated Mar. 15, 2019.
Communication dated Jul. 23, 2019 issued by the Taiwan Intellectual Property Office in counterpart Taiwan Application No. 106142570.

* cited by examiner

__US 10,833,041 B2__

FAN-OUT SEMICONDUCTOR PACKAGE

CROSS-REFERENCE TO RELATED APPLICATION(S)

This application claims benefit of priority to Korean Patent Application No. 10-2017-0097000 filed on Jul. 31, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals extend outwardly of a region in which a semiconductor chip is disposed.

BACKGROUND

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand as described above is a fan-out package. Such a fan-out package has a compact size and allows a plurality of pins to be implemented by redistributing connection terminals outwardly of a region in which a semiconductor chip is disposed.

SUMMARY

An aspect of the present disclosure may provide a fan-out semiconductor package in which a plurality of passive components may be mounted together with a semiconductor chip, a size and a thickness may be significantly reduced even though the plurality of passive components are mounted together with the semiconductor chip, and the number of processes and a cost may be reduced.

According to an aspect of the present disclosure, a fan-out semiconductor package may be provided, in which a component embedded structure having a plurality of passive components embedded therein is disposed and packaged adjacent to a semiconductor chip.

According to an aspect of the present disclosure, a fan-out semiconductor package may include a support member having a through-hole, a semiconductor chip disposed in the through-hole, a component embedded structure disposed adjacent to and spaced apart from the semiconductor chip in the through-hole by a predetermined distance, an encapsulant, and a connection member. The semiconductor chip has an active surface having connection pads disposed thereon and an inactive surface opposing the active surface. The component embedded structure has a plurality of passive components embedded therein. The encapsulant encapsulates at least portions of the support member, the component embedded structure, and the semiconductor chip. The connection member is disposed on the support member, the component embedded structure, and the active surface of the semiconductor chip. The connection member includes redistribution layers and vias electrically connecting the redistribution layers to the plurality of passive components and the connection pads of the semiconductor chip.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. The terms "first," "second," etc. may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an embodiment rather than limiting the present disclosure. In this case, singular forms include plural forms unless interpreted otherwise in context.

Electronic Device

Figure 1:
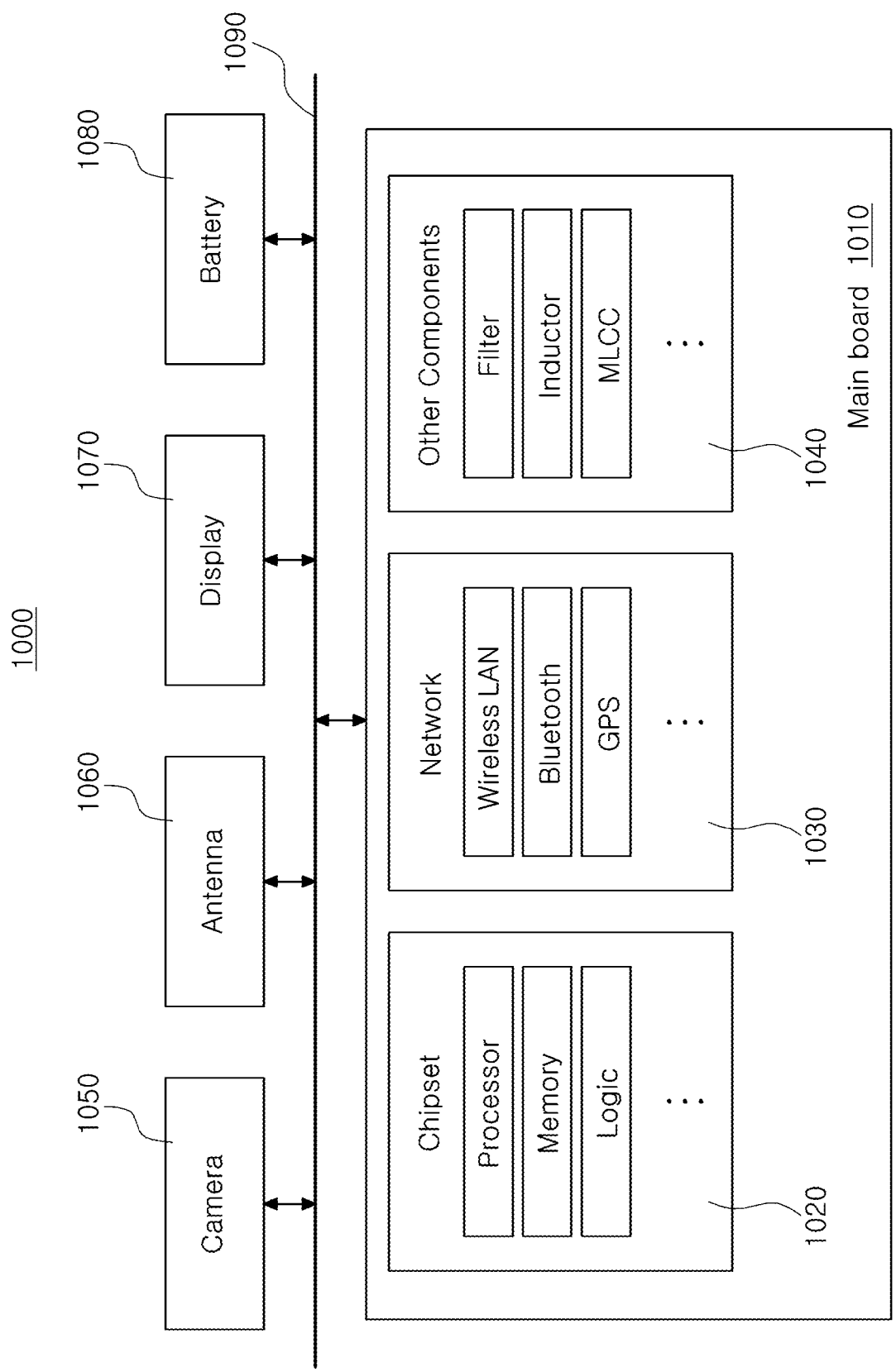
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 includes chip related components 1020, network related components 1030, other components 1040, and the like, physically or electrically connected to main board 1010. These components are connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as, for example, a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as, for example, wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include, without limitation, a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be, for example, a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
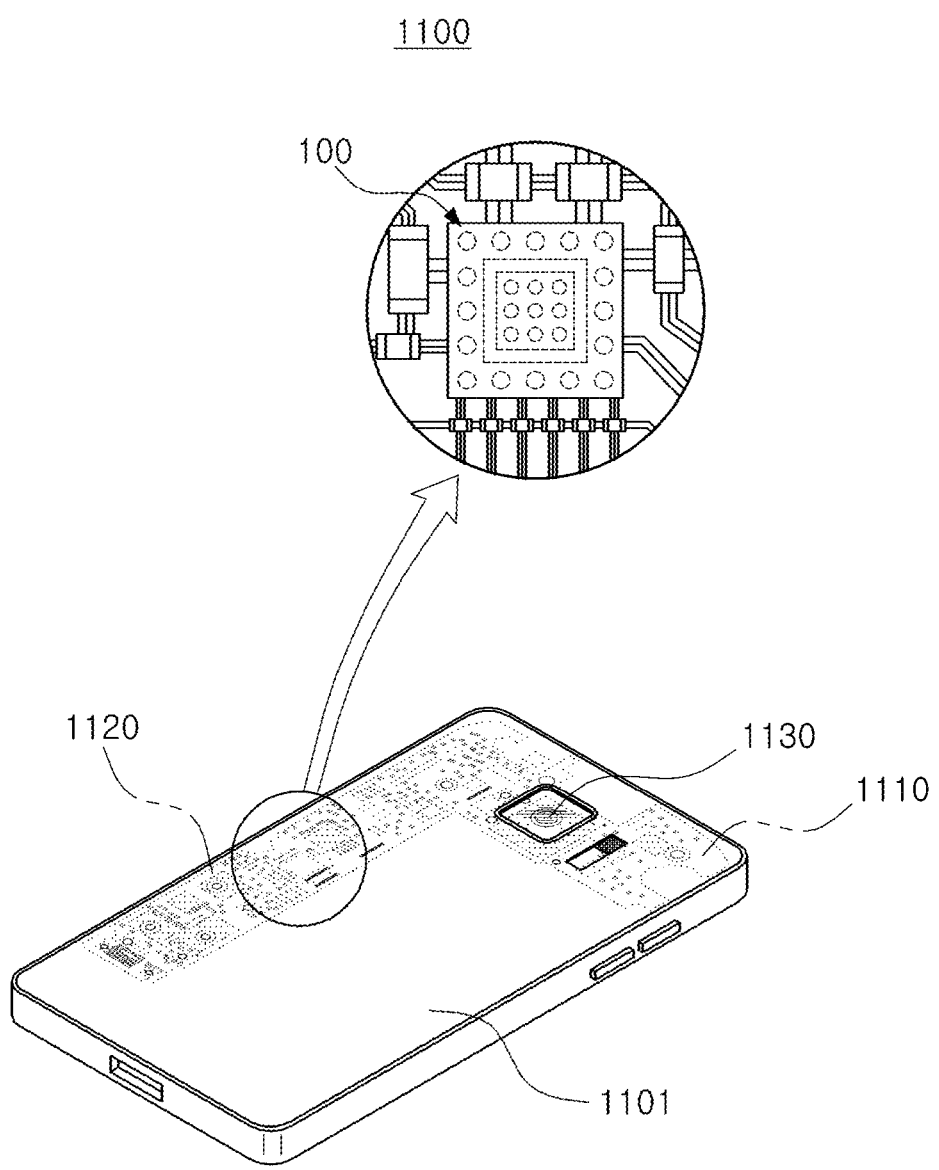
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board may be desirable.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
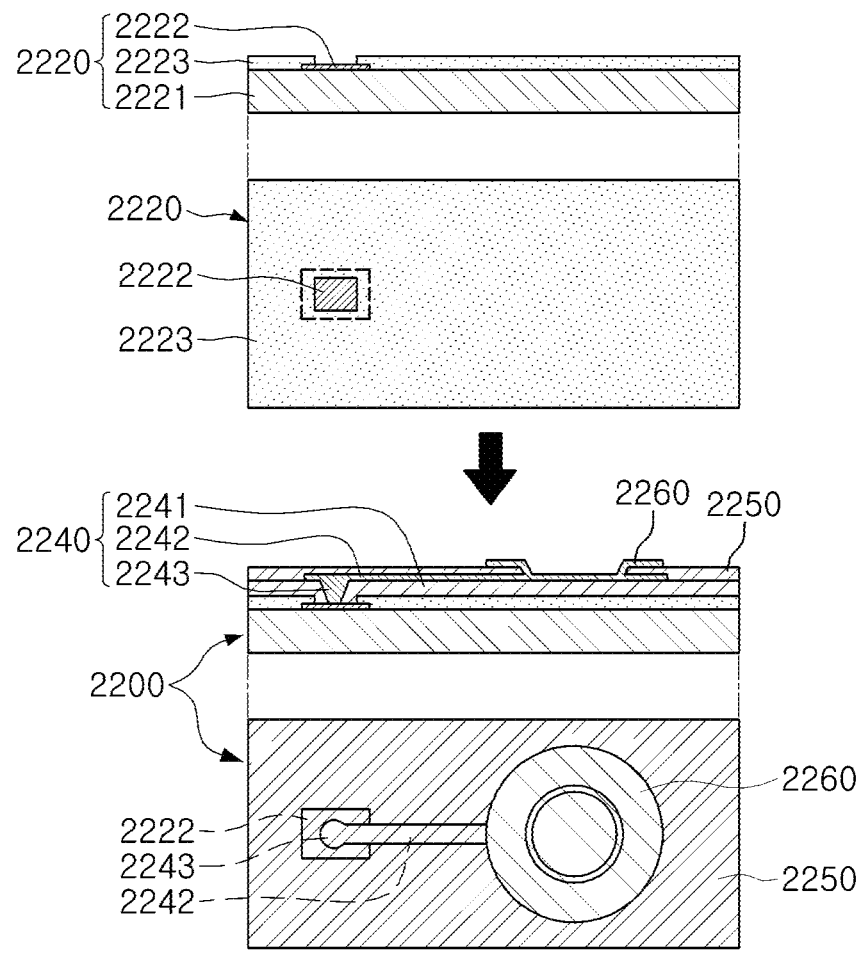
FIGS. 3A and 3B are schematic cross-sectional views illustrating states of a fan-in semiconductor package before and after being packaged.
Figure 3B:
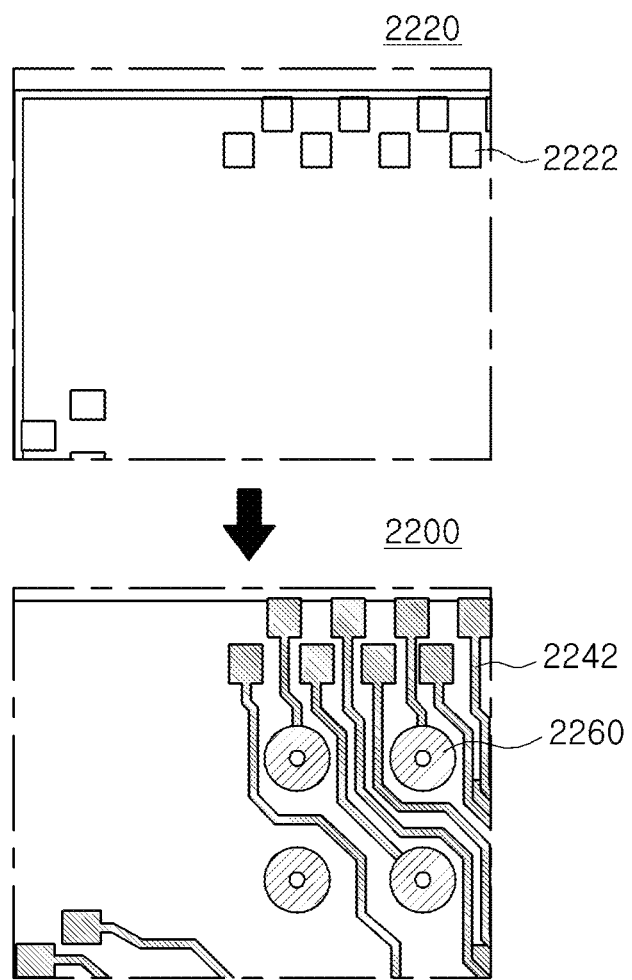

FIGS. 3A and 3B are schematic cross-sectional views illustrating states of a fan-in semiconductor package before and after being packaged.

Figure 4:
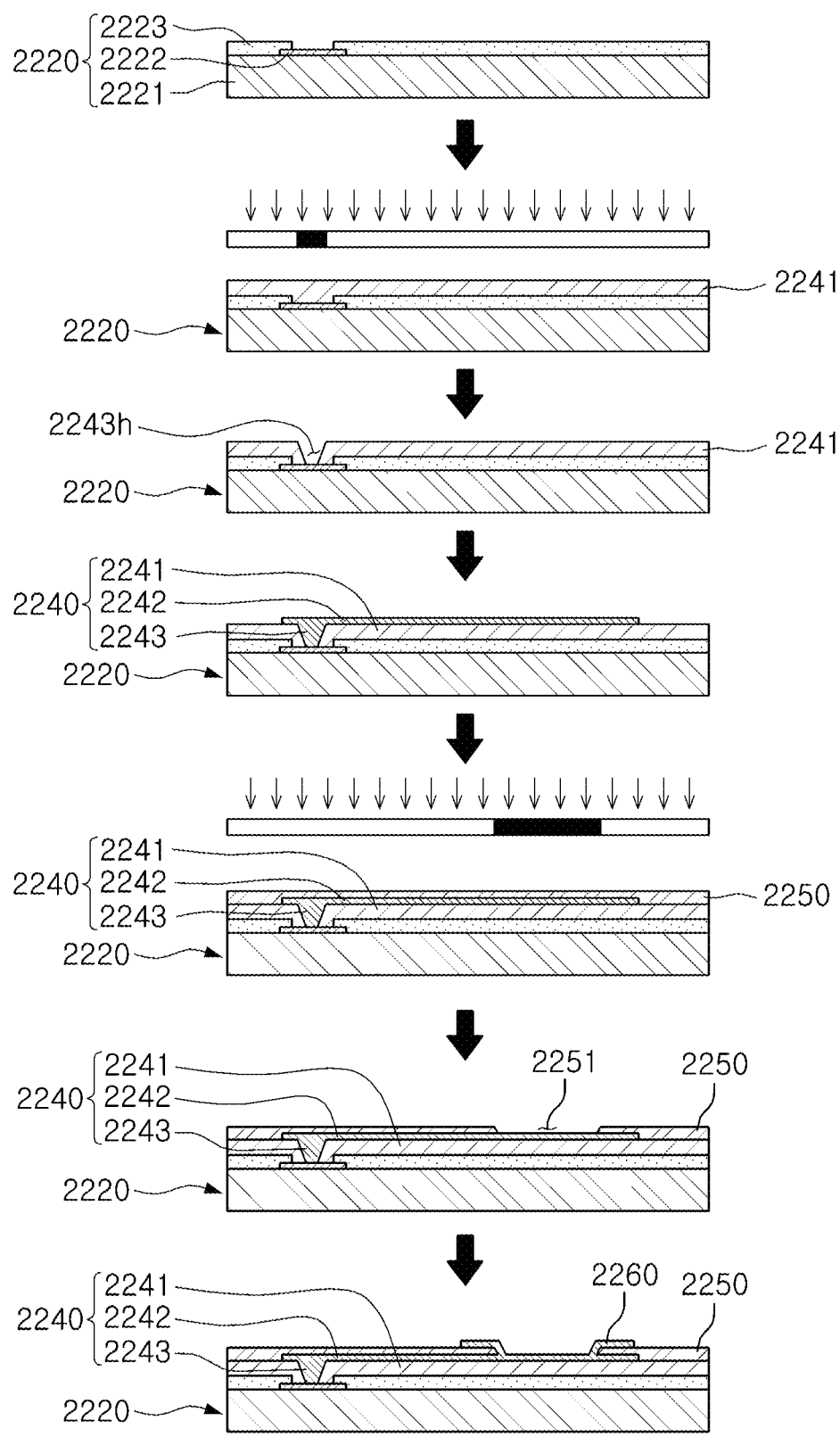
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including, without limitation, silicon (Si), germanium (Ge), gallium arsenide (GaAs), or the like, connection pads 2222 formed on one surface of the body 2221 and including a conductive material such as, for example, aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 is formed depending on a size of the semiconductor chip 2220 on the semiconductor chip 2220 in order to redistribute the connection pads 2222. The connection member 2240 is formed by forming an insulating layer 2241 on the semiconductor chip 2220 using an insulating material such as, for example, a photoimagable dielectric (PID) resin, forming via holes 2243h opening the connection pads 2222, and then forming wiring patterns 2242 and vias 2243. Then, a passivation layer 2250 protecting the connection member 2240 is formed, an opening 2251 is formed, and an underbump metal layer 2260, or the like, is formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the issues described above, the fan-in semiconductor package may not be directly mounted and used on the main board of the electronic device. Here, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
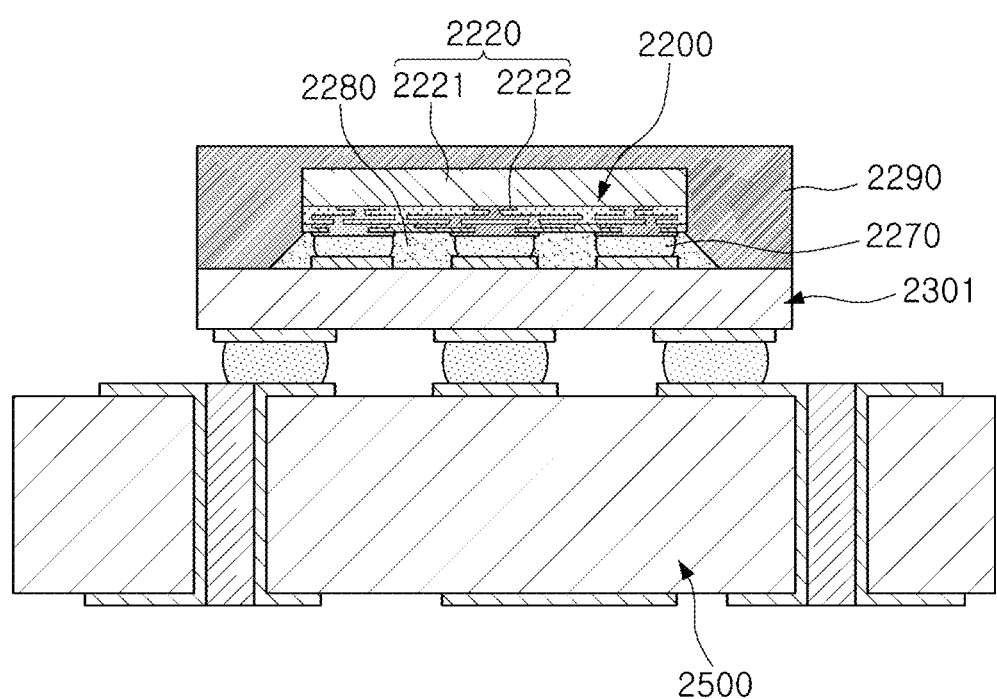
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
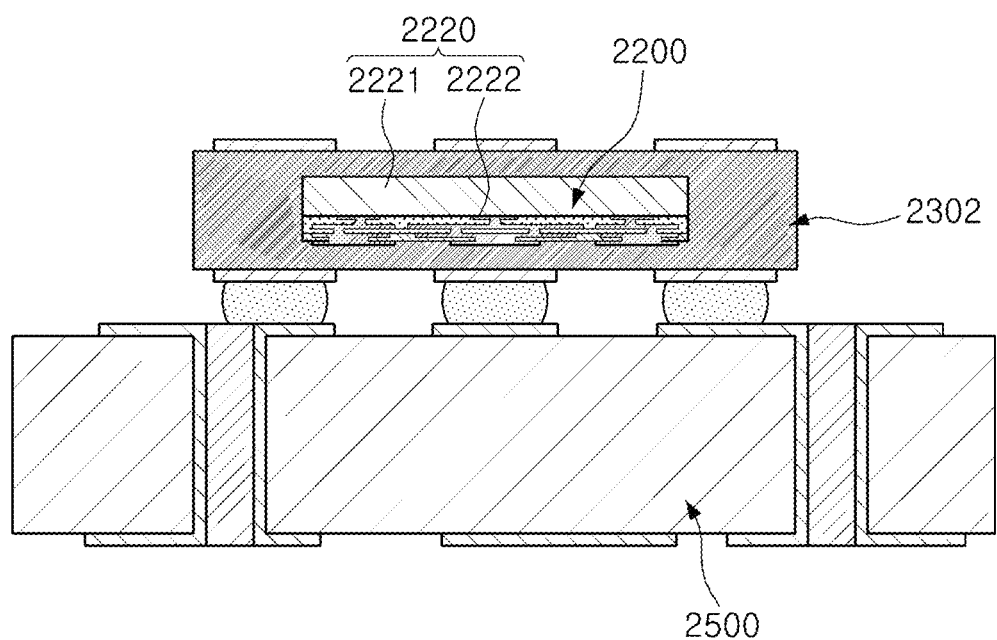
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 are redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, are fixed by an underfill resin 2280, or the like, and an outer side of the semiconductor chip 2220 is covered with a molding material 2290, or the like. Alternatively, a fan-in semiconductor package 2200 is embedded in a separate interposer substrate 2302, connection pads 2222, that is, I/O terminals, of the semiconductor chip 2220 are redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
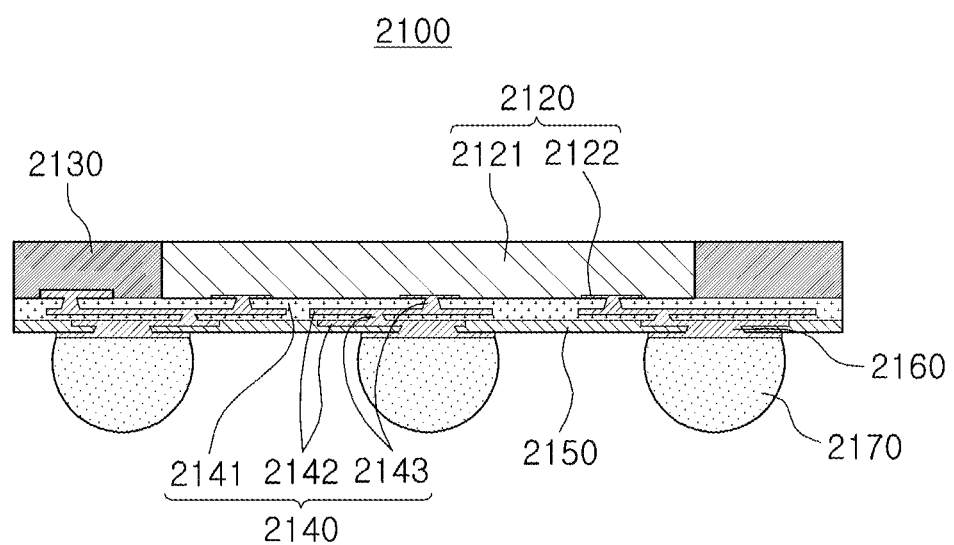
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 is protected by an encapsulant 2130, and connection pads 2122 of the semiconductor chip 2120 are redistributed outwardly of the semiconductor chip 2120 by a connection member 2140. In this case, a passivation layer 2150 is further formed on the connection member 2140, and an underbump metal layer 2160 is further formed in openings of the passivation layer 2150. Solder balls 2170 are further formed on the underbump metal layer 2160. The semiconductor chip 2120 may be an integrated circuit (IC)

including a body 2121, the connection pads 2122, a passivation layer (not illustrated), and the like. The connection member 2140 includes an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
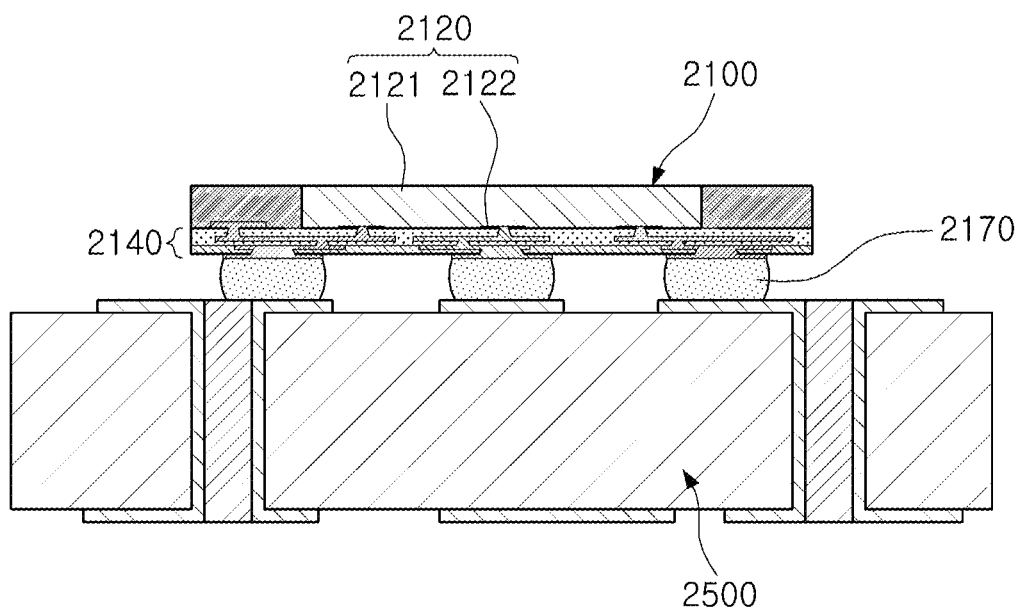
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 is mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

The fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a plurality of passive components may be mounted together with a semiconductor chip will hereinafter be described with reference to the drawings. In various embodiments disclosed herein, a size and a thickness may be significantly reduced even though the plurality of passive components are mounted together with the semiconductor chip, and the number of processes and a cost may be reduced.

Figure 9:
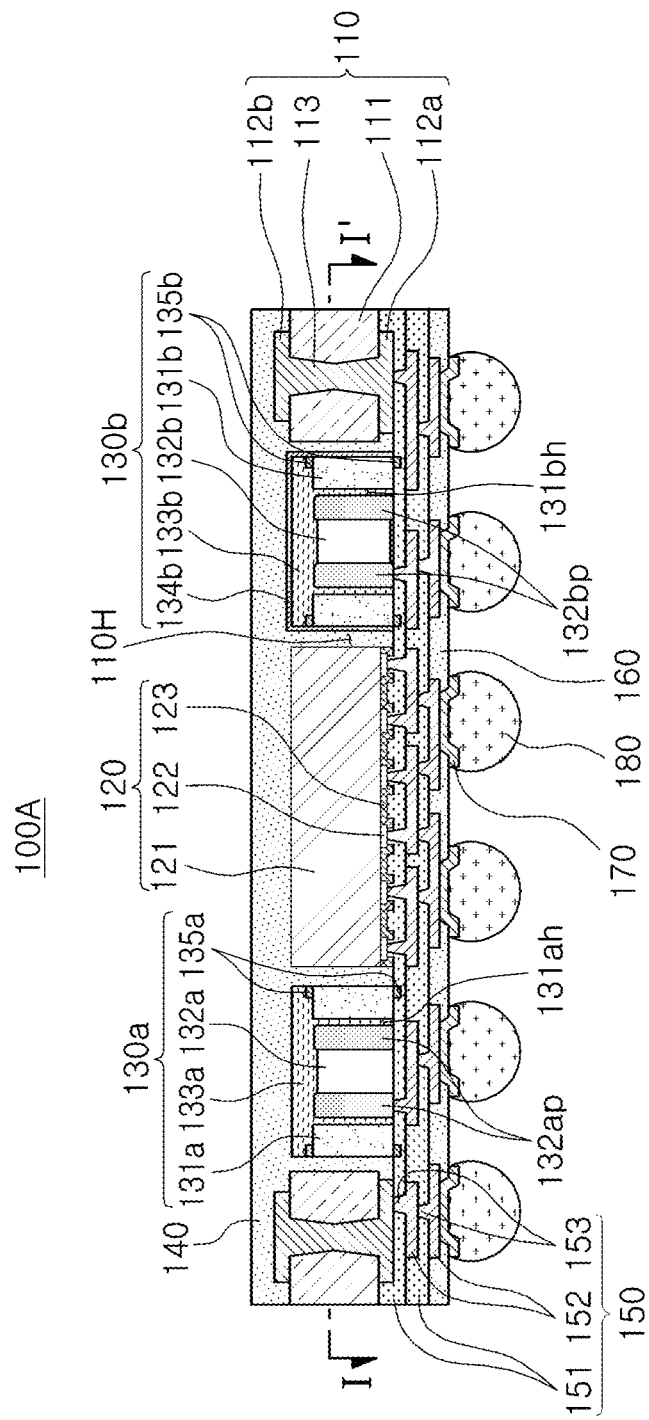
FIG. 9 is a schematic cross-sectional view illustrating an example of a fan-out semiconductor package.

FIG. 9 is a schematic cross-sectional view illustrating an example of a fan-out semiconductor package.

Figure 10:
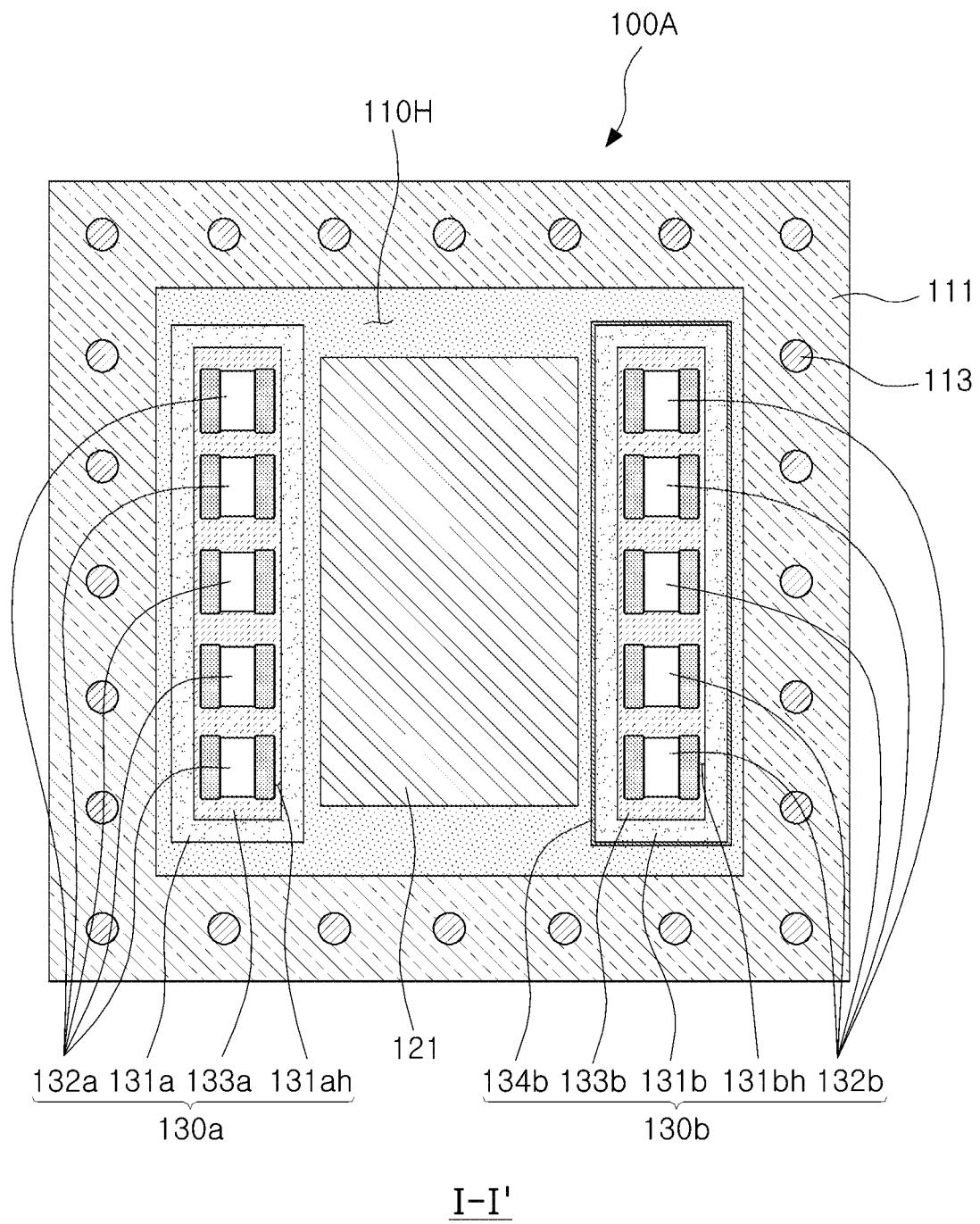
FIG. 10 is a schematic plan view taken along line I-I' of the fan-out semiconductor package of FIG. 9.

FIG. 10 is a schematic plan view taken along line IT of the fan-out semiconductor package of FIG. 9.

Referring to the drawings, a fan-out semiconductor package 100A according to an embodiment of the present disclosure includes a support member 110 having a through-hole 110H, a semiconductor chip 120 disposed in the through-hole 110H of the support member 110, first and second component embedded structures 130a and 130b disposed adjacent to the semiconductor chip 120 in the through-hole 110H of the support member 110 to be spaced apart from the semiconductor chip 120 by a predetermined distance and having a plurality of passive components 132a and 132b embedded in the component embedded structures 130a and 130b, respectively. The fan-out semiconductor package 100A further includes an encapsulant 140 encapsulating at least portions of the support member 110, the semiconductor chip 120, and the component embedded structures 130a and 130b. The fan-out semiconductor package 100A additionally includes a connection member 150 disposed on the support member 110, an active surface of the semiconductor chip 120, and the component embedded structures 130a and 130b. The connection member 150 includes redistribution layers 152 electrically connected to connection pads 122 of the semiconductor chip 120 and vias 153. The plurality of passive components 132a and 132b embedded in the component embedded structures 130a and 130b, respectively, are electrically connected to the connection pads 122 of the semiconductor chip 120 through the redistribution layers 152 and the vias 153 of the connection member 150. A passivation layer 160 is further disposed on the connection member 150, if necessary, an underbump metal layer 170 is further disposed in openings of the passivation layer 160, if necessary. Electrical connection structures 180 such as solder balls, or the like, are further disposed on the underbump metal layer 170, if necessary.

In general, in a case of a display module, semiconductor packages and passive components are mounted on a main board or a sub-board, respectively. Therefore, there is a limitation in narrowing an interval between the components on the board. Particularly, when several hundreds of small components are mounted on one board, a mounting cost and a defect rate are increased. In order to solve such a problem, a system in package (SIP) structure capable of reducing a mounting area and improving surface mounting technology (SMT) efficiency by implementing semiconductor chips and the passive components in one package may be considered. However, in the SIP structure, an interposer substrate is generally used, and thus, there is a limitation in reducing a thickness of the package. In addition, a passive component having a small size has insufficient close adhesion due to a small lower area, such that a delamination risk may be large, and several problems such as a molding defect, and the like, may be generated due to a thickness difference between the passive component having the small size and the semiconductor chip.

On the other hand, in the fan-out semiconductor package 100A according to an embodiment, the plurality of passive components 132a and 132b may be primarily packaged in forms of the component embedded structures 130a and 130b, respectively, and be then secondarily packaged in a state in which they are disposed adjacent to the semiconductor chip 120. In addition, instead of introduction of the interposer substrate, the connection member 150 including the redistribution layers 152 that may redistribute the connection pads 122 up to a fan-out region and the vias 153 connected to the redistribution layers 152 may be directly formed on the active surface of the semiconductor chip 120. Therefore, a thickness of the fan-out semiconductor package 100A may be significantly reduced. In addition, since the passive components 132a and 132b having a small size are configured in an array form through the component embedded structures 130a and 130b, they may secure sufficient mounted areas to secure close adhesion, such that a delamination risk of the passive components 132a and 132b may be suppressed. In addition, since a plurality of component embedded structures 130a and 130b are used, the component embedded structure 130b including some passive components 132b of which electromagnetic interference (EMI) needs to be blocked may be selectively covered with a metal layer 134b, and the EMI may thus be selectively blocked.

In addition, since the plurality of passive components 132a and 132b are introduced into the component embedded structures 130a and 130b, respectively, an encapsulation defect, or the like, due to a thickness difference between the semiconductor chip 120 and the passive components 132a and 132b may be prevented. In addition, since lower surfaces of the respective electrodes 132ap and 132bp of the plurality of passive components 132a and 132b, respectively, are exposed through lower surfaces of the component embedded structures 130a and 130b, the plurality of passive components 132a and 132b may be directly connected to the vias 153 of the connection member 150 without using a separate wiring layer, and may be connected to the redistribution layers 152 through the vias 153. Therefore, thicknesses of the component embedded structures 130a and 130b may be reduced, and an unnecessary wiring process may be omitted, such that processes may be simplified and a cost may be reduced.

In addition, in the fan-out semiconductor package 100A according to an embodiment, the component embedded structures 130a and 130b include substrates 131a and 131b having cavities 131ah and 131bh, respectively. The component embedded structures 130a and 130b have a structure in which the plurality of passive components 132a and 132b are disposed in the cavities 131ah and 131bh of the substrates 131a and 131b, respectively, and are encapsulated with resin layers 133a and 133b, respectively. A thickness deviation problem at the time of forming the resin layers 133a and 133b may be easily solved by introducing the substrates 131a and 131b, and maintenance of rigidity may be promoted through the substrates 131a and 131b.

In the fan-out semiconductor package 100A according to an embodiment, the support member 110 includes redistribution layers 112a and 112b that redistribute the connection pads 122. Therefore, a degree of freedom in a design may be increased, the number of layers of the connection member 150 may be reduced, such that thinness of the fan-out semiconductor package 100A may be further promoted, and a decrease in a yield depending on a defect at the time of forming the connection member 150 after the semiconductor chip 120 is disposed may be suppressed.

The respective components included in the fan-out semiconductor package 100A according to an embodiment will hereinafter be described in more detail.

The support member 110 includes the redistribution layers 112a and 112b redistributing the connection pads 122 of the semiconductor chip 120 to thus reduce the number of layers of the connection member 150. If necessary, the support member 110 improves rigidity of the fan-out semiconductor package 100A depending on certain materials, and serves to secure uniformity of a thickness of the encapsulant 140. The fan-out semiconductor package 100A according to an embodiment is utilized as a package-on-package (POP) type package by the support member 110. That is, the support member 110 may be used as another connection member. The support member 110 has the through-hole 110H. The semiconductor chip 120 and the component embedded structures 130a and 130b are disposed adjacent to each other in the through-hole 110H to be spaced apart from the support member 110 by a predetermined distance. In more detail, the semiconductor chip 120 is disposed between the component embedded structures 130a and 130b. The plurality of passive components 132a and 132b may be connected to the semiconductor chip 120 at a minimum signal distance through such a disposition. Side surfaces of the semiconductor chip 120 and the component embedded structures 130a and 130b may be surrounded by the support member 110. However, such a form is only an example and may be variously modified to have other forms, and the support member 110 may perform another function depending on such a form.

The support member 110 includes an insulating layer 111, a first redistribution layer 112a disposed on a lower surface of the insulating layer 111, a second redistribution layer 112b disposed on an upper surface of the insulating layer 111, and vias 113 penetrating through the insulating layer 111 and connecting the first and second redistribution layers 112a and 112b to each other. Thicknesses of the redistribution layers 112a and 112b of the support member 110 may be greater than those of the redistribution layers 152 of the connection member 150. Since the support member 110 may have a thickness similar to or greater than that of the semiconductor chip 120, or the component embedded structures 130a and 130b, the redistribution layers 112a and 112b may be formed at large sizes through a substrate process depending on a scale of the support member 110. On the other hand, the redistribution layers 152 of the connection member 150 may be formed at small sizes through a semiconductor process for thinness.

A material of the insulating layer 111 is not particularly limited. Any insulating material may be used as the material of the insulating layer 111. For example, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The redistribution layers 112a and 112b serve to redistribute the connection pads 122 of the semiconductor chip 120. In addition, the redistribution layers 112a and 112b may be used as connection patterns when the fan-out semiconductor package 100A according to an embodiment is used in a package-on-package (POP), or the like. A material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may perform various functions depending on designs of their corresponding layers. For example, the redistribution layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a and 112b may include via pads, wire pads, connection terminal pads, and the like.

The vias 113 may electrically connect the redistribution layers 112a and 112b formed on different layers to each other, resulting in an electrical path in the support member 110. A material of each of the vias 113 may be a conductive material such as copper (Cu), aluminum (Al), silver (Ag), tin (Sn), gold (Au), nickel (Ni), lead (Pb), titanium (Ti), or alloys thereof. Each of the vias 113 may be completely filled with the conductive material, or the conductive material may be formed along a wall of each of via holes. In addition, each of the vias 113 may have all of the known shapes such as a sandglass shape, a cylindrical shape, and the like.

Each of the semiconductor chips 120 may be an integrated circuit (IC) having several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. For example, the IC may be a memory chip such as a volatile memory (for example, a DRAM), a non-volatile memory (for example, a ROM), a flash memory, or the like, or a logic chip such as an analog-to-digital converter, an application-specific IC (ASIC), or the like. A larger number of semiconductor chips 120 than those illustrated in the drawings may be mounted together with the component embedded structures 130a and 130b in the fan-out semiconductor package 100A.

The semiconductor chip 120 may be an IC formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 140 through the passivation layer 123. Resultantly, bleeding of the encapsulant 140 into the lower surface of the connection pads 122 may be prevented to some extent. An insulating layer (not illustrated), and the like, may be further disposed in other positions, as required.

The component embedded structures 130a and 130b include the substrates 131a and 131b each having the cavities 131ah and 131bh, the plurality of passive components 132a and 132b each disposed in the cavities 131ah and 131bh of the substrates 131a and 131b, and the resin layers 133a and 133b each surrounding at least portions of the plurality of passive components 132a and 132b, respectively. The second component embedded structure 130b further includes the metal layer 134b surrounding an outer surface. Conductive patterns 135a and 135b that may be used as mark patterns, or the like, are disposed on upper and lower surfaces of the substrates 131a and 131b, respectively. Thicknesses of the component embedded structures 130a and 130b may be smaller than that of the support member 110. In this case, when the component embedded structures 130a and 130b are encapsulated with the encapsulant 140, a defect rate may be reduced.

Each of the substrates 131a and 131b may be formed of a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, or the like. That is, each of the substrates 131a and 131b may be a copper clad laminate (CCL), an unclad CCL, or the like. The cavities 131ah and 131bh formed in the substrates 131a and 131b, respectively, penetrate through the substrates 131a and 131b, respectively.

The passive components 132a and 132b may be capacitors, inductors, filters, or the like. For example, the passive components 132a included in the first component embedded structure 130a may be the capacitors, and the passive components 132b included in the second component embedded structure 130b may be the inductors. The inductors, more specifically, power inductors are elements emitting a relatively large amount of electromagnetic wave, and the metal layer 134b may thus be selectively formed in only the component embedded structure 130b including the inductors to implement blocking of the EMI. The passive components 132a and 132b included in the component embedded structures 130a and 130b, respectively, may have different thicknesses. The passive components 132a and 132b may be embedded in the resin layers 133a and 133b of the component embedded structures 130a and 130b, respectively, and may be embedded so that the lower surfaces of the respective electrodes 132ap and 132bp thereof are exposed from the resin layers 133a and 133b. In this case, the electrodes 132ap and 132bp may be in direct contact with the vias 153 of the connection member 150, and a process of forming a separate wiring layer may thus be omitted. Resultantly, the thicknesses of the component embedded structures 130a and 130b may be reduced, processes may be simplified, and a cost may be reduced.

The resin layers 133a and 133b may protect the passive components 132a and 132b, respectively. The resin layers 133a and 133b surround at least portions of the passive components 132a and 132b, respectively. Each of the resin layers 133a and 133b may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an epoxy molding compound (EMC), or the like, may be used.

The metal layer 134b may block the EMI of, for example, the second component embedded structure 130b. The metal layer 134b may be formed of a conductive material such as copper (Cu), aluminum (Al), silver (Ag), tin (Sn), gold (Au), nickel (Ni), lead (Pb), titanium (Ti), or alloys thereof. The metal layer 134b may be electrically connected to ground patterns of the redistribution layer 152 of the connection member 150.

The encapsulant 140 protects the support member 110, the semiconductor chip 120, the component embedded structures 130a and 130b, and the like. An encapsulation form of the encapsulant 140 is not particularly limited, but may be a form in which the encapsulant 140 surrounds at least portions of the support member 110, the semiconductor chip 120, the component embedded structures 130a and 130b, and the like. For example, the encapsulant 140 covers the support member 110, the component embedded structures 130a and 130b, and the inactive surface of the semiconductor chip 120, and fill spaces between walls of the through-hole 110H and the side surfaces of the semiconductor chip 120 and the component embedded structures 130a and 130b. In addition, the encapsulant 140 may also fill at least a portion of a space between the passivation layer 123 of the semiconductor chip 120 and the connection member 150. The encapsulant 140 may fill the through-hole 110H to thus serve as an adhesive for the semiconductor chip 120 and the component embedded structures 130a and 130b and reduce buckling of the semiconductor chip 120 and the component embedded structures 130a and 130b depending on certain materials.

The encapsulant 140 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an epoxy molding compound (EMC), or the like, may also be used. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material.

When a material including a glass fiber, an inorganic filler, and an insulating resin is used as the material of the encapsulant 140, warpage of the fan-out semiconductor package 100A may be effectively controlled without performing an additional process. In detail, the encapsulant 140 may include the glass fiber to maintain rigidity of the fan-out semiconductor package 100A. In addition, the encapsulant 140 may include the inorganic filler, and a CTE may thus be adjusted. Therefore, occurrence of the warpage of the fan-out semiconductor package 100 due to mismatch between CTEs may be suppressed. A material of the encapsulant 140 may encapsulate the support member 110, the component embedded structures 130a and 130b, and the semiconductor chip 120 in a b-stage. Therefore, the insulating resin and the inorganic filler of the encapsulant 140 may not only be disposed on the support member 110, the component embedded structures 130a and 130b, and the inactive surface of the semiconductor chip 120, but also be disposed in the spaces between the walls of the through-hole 110H and the side surfaces of the semiconductor chip 120 and the component embedded structures 130a and 130b. On the other hand, the glass fiber of the encapsulant 140 may be disposed on only the support member 110, the component embedded structures 130a and 130b, and the inactive surface of the semiconductor chip 120. Rigidity of the fan-out semiconductor package 100A at an upper portion of the fan-out semiconductor package 100A may be maintained by disposing the glass fiber in such a form.

The connection member 150 redistributes the connection pads 122 of the semiconductor chip 120. Several tens to several hundreds of connection pads 122 of the semiconductor chip 120 having various functions may be redistributed by the connection member 150, and may be physically or electrically connected to an external source through the electrical connection structures 180 depending on the functions. In addition, the connection member 150 may electrically connect the semiconductor chip 120 and the passive components 132a and 132b of the component embedded structures 130a and 130b to each other. The connection member 150 includes insulating layers 151, the redistribution layers 152 disposed on the insulating layers 151, and the vias 153 penetrating through the insulating layers 151 and connected to the redistribution layers 152. The connection member 150 may be formed of a single layer, or may be formed of a plurality of layers of which the number is greater than that illustrated in the drawings.

A material of each of the insulating layers 151 may be an insulating material. In this case, a photosensitive insulating material such as a PID resin may also be used as the insulating material. That is, the insulating layer 151 may be a photosensitive insulating layer. When the insulating layer 151 has photosensitive properties, the insulating layer 151 may be formed to have a smaller thickness, and a fine pitch of the via 153 may be achieved more easily. The insulating layer 151 may be a photosensitive insulating layer including an insulating resin and an inorganic filler. When the insulating layers 151 are multiple layers, materials of the insulating layers 151 may be the same as each other, and may also be different from each other, if necessary. When the insulating layers 151 are the multiple layers, the insulating layers 151 may be integrated with each other depending on a process, such that a boundary therebetween may also not be apparent.

The redistribution layers 152 may substantially serve to redistribute the connection pads 122. A material of each of the redistribution layers 152 may be a conductive material such as copper (Cu), aluminum (Al), silver (Ag), tin (Sn), gold (Au), nickel (Ni), lead (Pb), titanium (Ti), or alloys thereof. The redistribution layers 152 may perform various functions depending on designs of their corresponding layers. For example, the redistribution layers 152 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 152 may include via pads, connection terminal pads, and the like.

The vias 153 electrically connect the redistribution layers 152, the connection pads 122, the electrodes 132ap and 132bp, or the like, formed on different layers to each other, resulting in an electrical path in the fan-out semiconductor package 100A. A material of each of the vias 153 may be a conductive material such as copper (Cu), aluminum (Al), silver (Ag), tin (Sn), gold (Au), nickel (Ni), lead (Pb), titanium (Ti), or alloys thereof. Each of the vias 153 may be completely filled with the conductive material, or the conductive material may also be formed along a wall of each of the vias. In addition, each of the vias 153 may have all of the shapes known in the related art, such as a tapered shape, a cylindrical shape, and the like.

The passivation layer 160 protects the connection member 150 from external physical or chemical damage. The passivation layer 160 has openings exposing at least portions of the redistribution layer 152 of the connection member 150. The number of openings formed in the passivation layer 160 may be several tens to several thousands. The passivation layer 160 may include an insulating resin and an inorganic filler, but may not include a glass fiber. For example, the passivation layer 160 may be formed of ABF, but is not limited thereto.

The underbump metal layer 170 may improve connection reliability of the electrical connection structures 180 to improve board level reliability of the fan-out semiconductor package 100A. The underbump metal layer 170 is connected to the redistribution layer 152 of the connection member 150 exposed through the openings of the passivation layer 160. The underbump metal layer 170 may be formed in the openings of the passivation layer 160 by a known metallization method using the known conductive material such as a metal, but is not limited thereto.

The electrical connection structures 180 may be additionally configured to physically or electrically externally connect the fan-out semiconductor package 100A. For example, the fan-out semiconductor package 100A may be mounted on the main board of the electronic device through the electrical connection structures 180. Each of the electrical connection structures 180 may be formed of a conductive material, for example, a solder, or the like. However, this is only an example, and a material of each of the electrical connection structures 180 is not particularly limited thereto. Each of the electrical connection structures 180 may be a land, a ball, a pin, or the like. The electrical connection structures 180 may be formed as a multilayer or single layer structure. When the electrical connection structures 180 are formed as a multilayer structure, the electrical connection structures 180 may include a copper (Cu) pillar and a solder. When the electrical connection structures 180 are formed as a single layer structure, the electrical connection structures 180 may include a tin-silver solder or copper (Cu). However, these are only examples, and the electrical connection structures 180 are not limited thereto.

The number, an interval, a disposition form, and the like, of electrical connection structures 180 are not particularly limited, but may be sufficiently modified depending on design particulars by those skilled in the art. For example, the electrical connection structures 180 may be provided in an amount of several tens to several thousands according to the number of connection pads 122, or may be provided in an amount of several tens to several thousands or more or several tens to several thousands or less. When the electrical connection structures 180 are solder balls, the electrical connection structures 180 may cover side surfaces of the underbump metal layer 170 extending onto one surface of the passivation layer 160, to provide improved connection reliability.

At least one of the electrical connection structures 180 may be disposed in a fan-out region. The fan-out region is a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Although not illustrated in the drawings, a metal thin film may be formed on the walls of the through-hole 110H of the support member 110, if necessary, in order to dissipate heat and/or block EMI.

FIGS. 11A-11F show schematic views illustrating component embedded structures of FIG. 9 at various stages of manufacturing according to an example of processes of manufacturing.

Figure 11A:
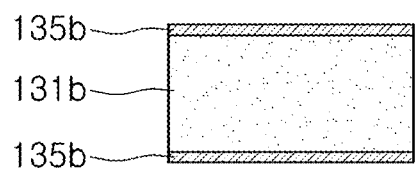
FIGS. 11A-11F are schematic views illustrating component embedded structures of FIG. 9 during various stages of manufacturing according to an example of processes of manufacturing.
Figure 11B:
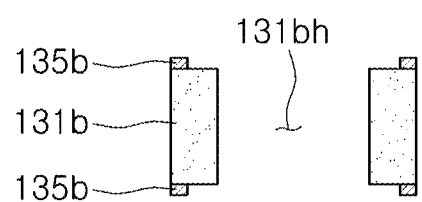
Figure 11C:
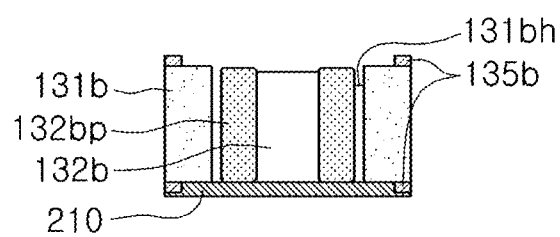
Figure 11D:
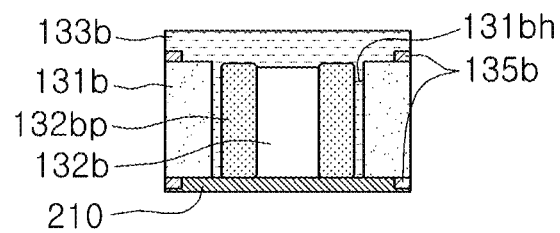
Figure 11E:
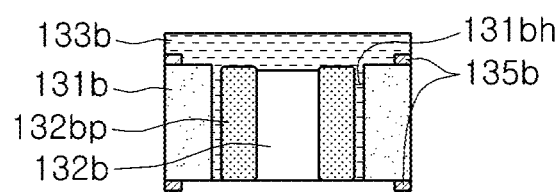
Figure 11F:
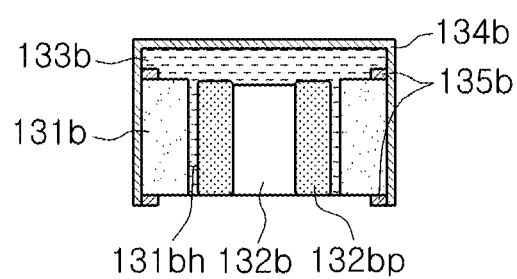

Referring to FIG. 11A, the substrate 131b having the conductive patterns 135b formed on opposite surfaces thereof is first prepared. As the substrate 131b, the CCL, or the like, as described above may be used. Next, as seen in FIG. 11B the cavity 131bh is formed in the substrate 131b. The cavity 131bh may be formed using laser drilling, mechanical drilling, or the like, and may be formed through chemical treatment, if necessary. The conductive patterns 135b may also be patterned as desired patterns. Then, as see in FIG. 11C, a tape 210 is attached to a lower surface of the substrate 131b, and the passive components 132b is attached to the tape 210 exposed through the cavity 131bh. Then, as seen in FIG. 11D, the passive components 132b are encapsulated with the resin layer 133b. Referring then to FIG. 11E, the tape 210 is removed. FIG. 11F shows the metal layer 134b, formed using, for example, sputtering, or the like. The series of processes are processes of forming the second component embedded structure 130b, but the first component embedded structure 130a may also be formed by a method that is substantially the same as the method described above except that the metal layer 134b is formed.

Figure 12A:
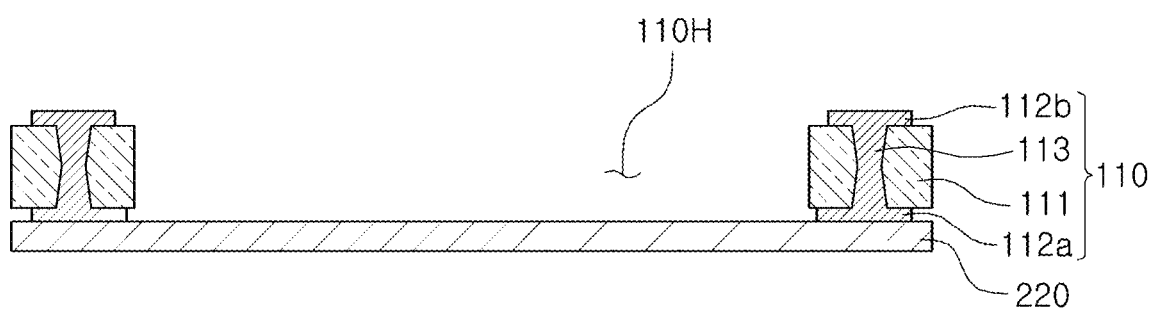
FIGS. 12A-12C are schematic views illustrating the fan-out semiconductor package of FIG. 9 during various stages of manufacturing according to an example of processes of manufacturing.
Figure 12B:
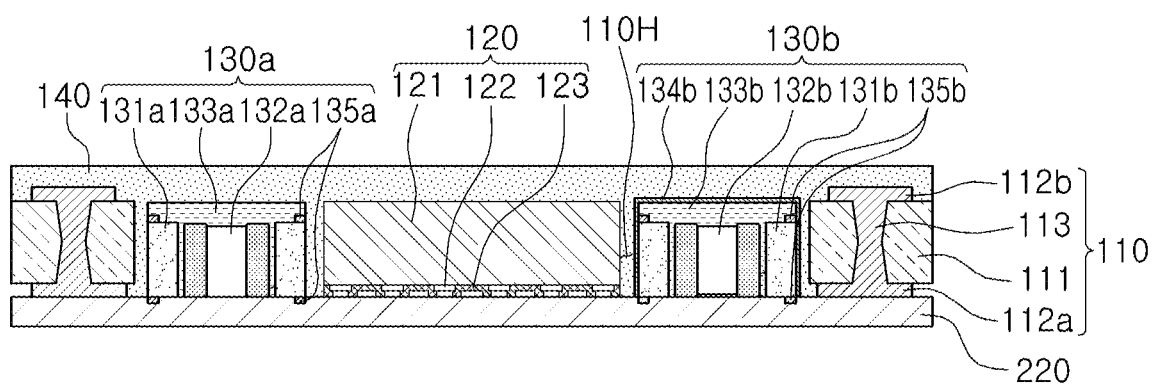
Figure 12C:
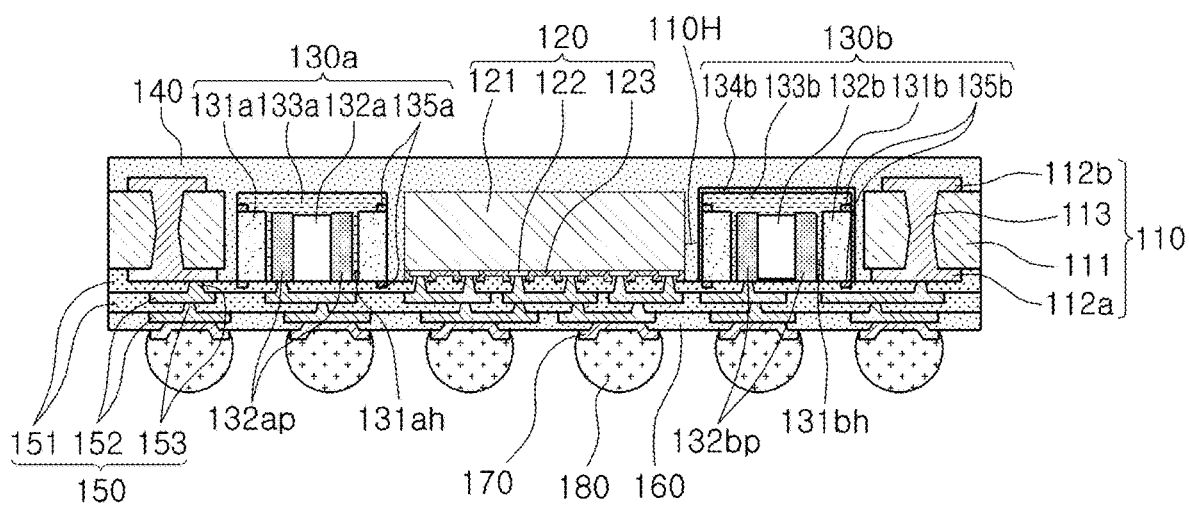

FIGS. 12A-12C are schematic views illustrating the fan-out semiconductor package of FIG. 9 at various stages of manufacturing according to an example of processes of manufacturing.

Referring to FIG. 12A, the support member 110 having the through-hole 110H is first prepared. The support member 110 may be prepared by a method of forming the redistribution layers 112a and 112b, the vias 113, and the like, through the known plating process such as electroplating, electroless plating, or the like, using a CCL, or the like. The through-hole 110H may be formed using laser drilling, mechanical drilling, or the like, or using a chemical treatment. As shown in FIG. 12B, a tape 220 is then attached to a lower surface of the prepared support member 110. The tape 220 may be the known adhesive film. Then, the semiconductor chip 120 and the component embedded structures 130a and 130b are attached to the tape 220 exposed in the through-hole 110H. Then, the semiconductor chip 120 and the component embedded structures 130a and 130b may be encapsulated using the encapsulant 140. As shown in FIG. 12C the tape 220 is then removed, and the connection member 150, the passivation layer 160, the underbump metal layer 170, and the electrical connection structures 180 are formed in a region in which the tape 220 is removed. The connection member 150 may be formed by forming the insulating layers 151 using a PID, or the like, and drilling via holes by a photolithography method, and then performing patterning by a plating process to form the redistribution layers 152 and the vias 153. The passivation layer 160 may be formed by a known lamination method or applying and hardening method. The underbump metal layer 170 may be formed by a known metallization process. The electrical connection structures 180 may be formed by performing a reflow process, or the like, on solders, or the like.

Figure 13:
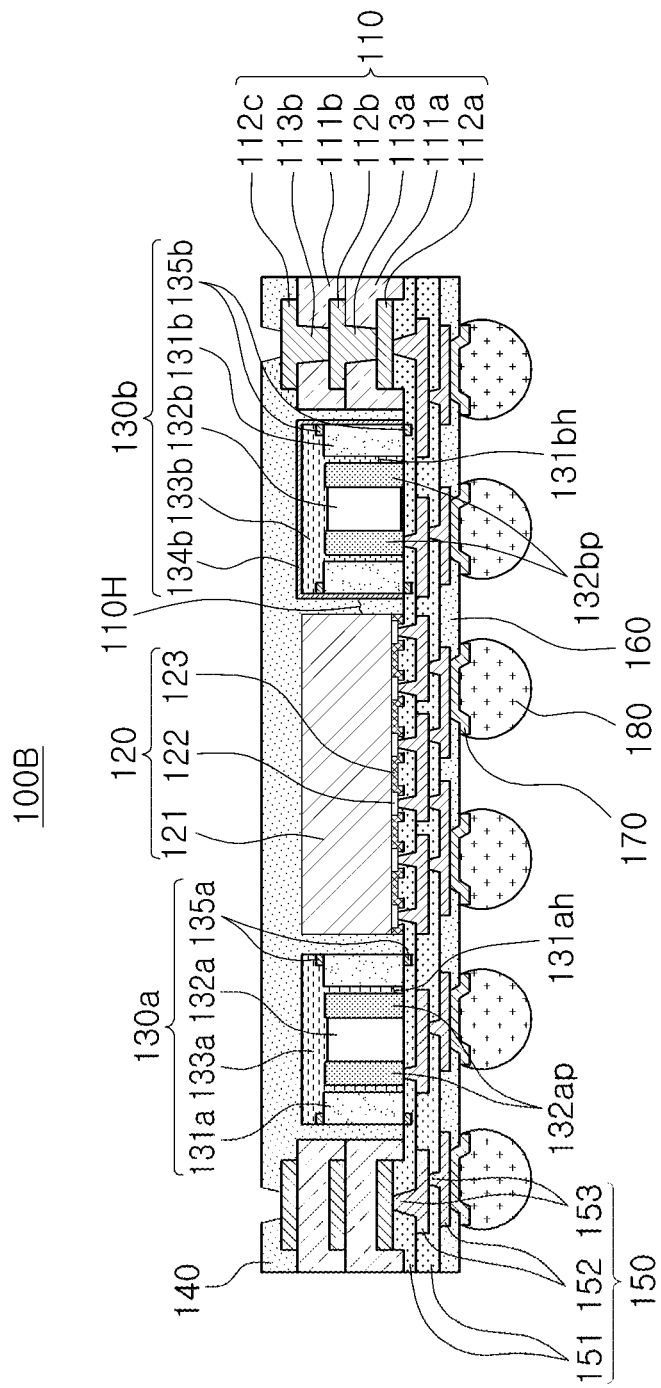
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, in a fan-out semiconductor package 100B according to another embodiment of the present disclosure, a support member 110 includes a first insulating layer 111a in contact with a connection member 150, a first redistribution layer 112a in contact with the connection member 150 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c are electrically connected to connection pads 122. The first and second redistribution layers 112a and 112b and the second and third redistribution layers 112b and 112c are electrically connected to each other through first and second vias 113a and 113b penetrating through the first and second insulating layers 111a and 111b, respectively.

When the first redistribution layer 112a is embedded in the first insulating layer 111a, a step generated due to a thickness of the first redistribution layer 112a may be significantly reduced, and an insulating distance of the connection member 150 may thus become constant. That is, a difference between a distance from a redistribution layer 152 of the connection member 150 to a lower surface of the first insulating layer 111a and a distance from the redistribution layer 152 of the connection member 150 to the connection pad 122 of a semiconductor chip 120 may be smaller than a thickness of the first redistribution layer 112a. Therefore, a high density wiring design of the connection member 150 may be easy.

The lower surface of the first redistribution layer 112a of the support member 110 may be disposed on a level above a lower surface of the connection pad 122 of the semiconductor chip 120. In addition, a distance between the redistribution layer 152 of the connection member 150 and the first redistribution layer 112a of the support member 110 may be greater than that between the redistribution layer 152 of the connection member 150 and the connection pad 122 of the semiconductor chip 120. Here, the first redistribution layer 112a may be recessed into the first insulating layer 111a. As described above, when the first redistribution layer 112a is recessed into the first insulating layer 111a, such that the lower surface of the first insulating layer 111a and the lower surface of the first redistribution layer 112a have a step therebetween, bleeding of the encapsulant 140 into the first redistribution layer 112a may be prevented. The second redistribution layer 112b of the support member 110 may be disposed on a level between an active surface and an inactive surface of the semiconductor chip 120. The support member 110 may be formed at a thickness corresponding to that of the semiconductor chip 120. Therefore, the second redistribution layer 112b formed in the support member 110 may be disposed on the level between the active surface and the inactive surface of the semiconductor chip 120.

Thicknesses of the redistribution layers 112a, 112b, and 112c of the support member 110 may be greater than those of the redistribution layers 152 of the connection member 150. Since the support member 110 may have a thickness equal to or greater than that of the semiconductor chip 120, the redistribution layers 112a, 112b, and 112c may be formed at large sizes depending on a scale of the support member 110. On the other hand, the redistribution layers 152 of the connection member 150 may be formed at relatively small sizes for thinness.

A description of other configurations and a manufacturing method overlaps that described above in the fan-out semiconductor package 100A, and is thus omitted.

Figure 14:
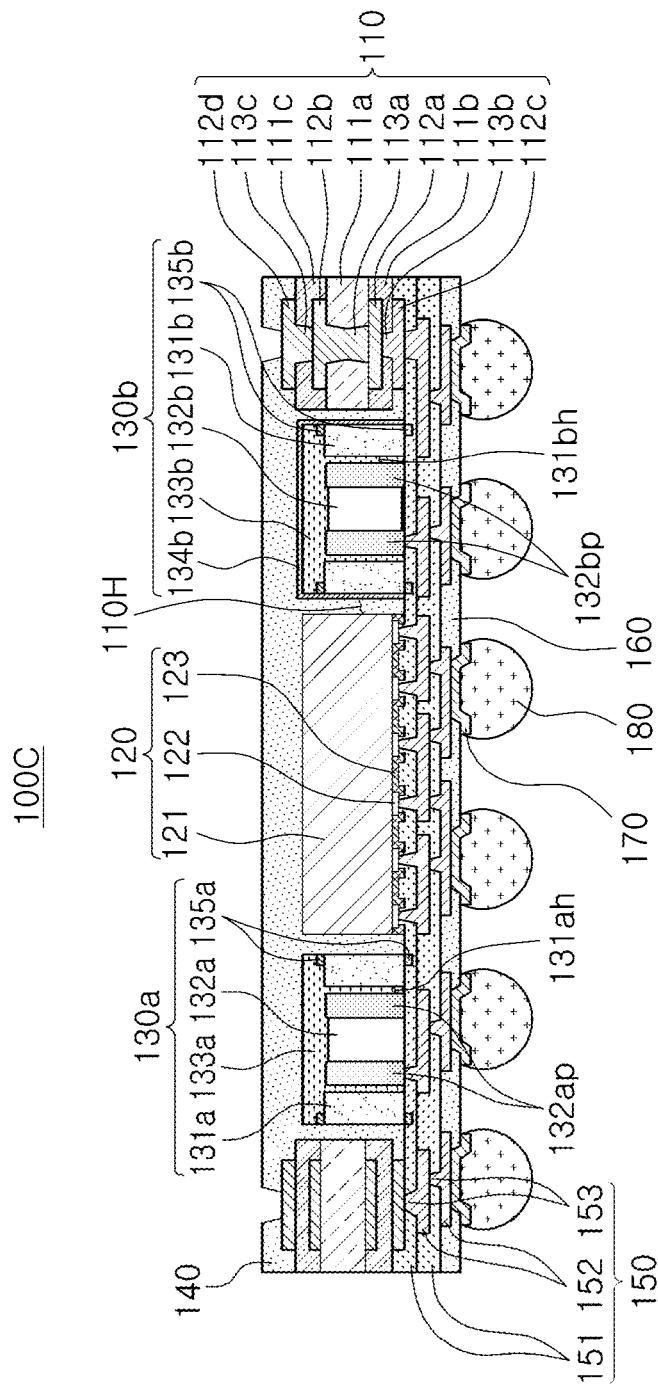
FIG. 14 is a schematic cross-sectional view illustrating yet another example of a fan-out semiconductor package.

FIG. 14 is a schematic cross-sectional view illustrating yet another example of a fan-out semiconductor package.

Referring to the drawing, in a fan-out semiconductor package 100C according to yet another embodiment of the present disclosure, a support member 110 includes a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d are electrically connected to connection pads 122. Since the support member 110 may include a large number of redistribution layers 112a, 112b, 112c, and 112d, a connection member 150 may be further simplified. Therefore, a decrease in a yield depending on a defect occurring in a process of forming the connection member 150 may be suppressed. Meanwhile, the first to fourth redistribution layers 112a, 112b, 112c, and 112d may be electrically connected to each other through first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a glass fiber, an inorganic filler, and an insulating resin, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c each penetrating through the second insulating layer 111b and the third insulating layer 111c.

A lower surface of the third redistribution layer 112c of the support member 110 may be disposed on a level below a lower surface of the connection pad 122 of a semiconductor chip 120. In addition, a distance between a redistribution layer 152 of the connection member 150 and the third redistribution layer 112c of the support member 110 may be smaller than that between the redistribution layer 152 of the connection member 150 and the connection pad 122 of the semiconductor chip 120. Here, the third redistribution layer 112c may be disposed in a protruding form on the second insulating layer 111b, resulting in being in contact with the connection member 150. The first redistribution layer 112a and the second redistribution layer 112b of the support member 110 may be disposed on a level between an active surface and an inactive surface of the semiconductor chip 120. The support member 110 may be formed at a thickness corresponding to that of the semiconductor chip 120. Therefore, the first redistribution layer 112a and the second redistribution layer 112b formed in the support member 110 may be disposed on the level between the active surface and the inactive surface of the semiconductor chip 120.

Thicknesses of the redistribution layers 112a, 112b, 112c, and 112d of the support member 110 may be greater than those of the redistribution layers 152 of the connection member 150. Since the support member 110 may have a thickness equal to or greater than that of the semiconductor chip 120, the redistribution layers 112a, 112b, 112c, and 112d may be formed at large sizes. On the other hand, the redistribution layers 152 of the connection member 150 may be formed at relatively small sizes for thinness.

A description of other configurations and a manufacturing method overlaps that described above in the fan-out semiconductor package 100A, and is thus omitted.

As set forth above, according to an embodiments of the present disclosure, a fan-out semiconductor package in which a plurality of passive components may be mounted together with a semiconductor chip, a size and a thickness may be significantly reduced even though the plurality of passive components are mounted together with the semiconductor chip, and the number of processes and a cost may be reduced may be provided. The fan-out semiconductor package according to the present disclosure described above may substitute for a display module structure according to the related art.

While embodiments have been shown and described above, it will be apparent to those skilled in the art that modifications and variations could be made without departing from the scope of the present disclosure as defined by the appended claims.

What is claimed is:

1. A fan-out semiconductor package comprising:
a semiconductor chip comprising:
an active surface having connection pads disposed thereon; and
an inactive surface opposing the active surface;
a component embedded structure disposed adjacent to and spaced apart from the semiconductor chip by a predetermined distance, the component embedded structure comprising:
a substrate, the substrate comprising a cavity;
a plurality of passive components disposed in the cavity, each passive component of the plurality of passive components comprising electrodes that cover an entirety of vertical sidewalls of the respective passive components; and
a resin layer covering the plurality of passive components and the electrodes within the cavity such that the resin directly contacts respective top surfaces of the electrodes adjacent to a top surface of the respective passive components;
an encapsulant encapsulating at least portions of the component embedded structure and the semiconductor chip; and
a connection member disposed on the component embedded structure, and the active surface of the semiconductor chip, wherein the connection member includes:
redistribution layers; and
vias electrically connecting the redistribution layers to the plurality of passive components and the connection pads of the semiconductor chip.

2. The fan-out semiconductor package of claim 1, wherein:
lower surfaces of the electrodes of the plurality of passive components are exposed from a lower surface of the resin layer to be connected to the vias of the connection member.

3. The fan-out semiconductor package of claim 2, wherein outer surfaces of the component embedded structure except for a lower surface of the component embedded structure are covered with a metal layer.

4. The fan-out semiconductor package of claim 3, wherein the metal layer is connected to ground patterns of the redistribution layers of the connection member.

5. The fan-out semiconductor package of claim 1, wherein:
the component embedded structure includes a first component embedded structure and a second component embedded structure, the first component embedded structure and the second component embedded structure disposed adjacent to and spaced apart from each other by a predetermined distance, each of the first component embedded structure and the second component embedded structure having a plurality of passive components embedded therein, respectively, and
the semiconductor chip is disposed between the first component embedded structure and the second component embedded structure.

6. The fan-out semiconductor package of claim 5, wherein outer surfaces of either of the first component embedded structure and the second component embedded structure except for a lower surface of any one of the first component embedded structure and the second component embedded structure are covered with a metal layer.

7. The fan-out semiconductor package of claim 6, wherein the metal layer is connected to ground patterns of the redistribution layers of the connection member.

8. The fan-out semiconductor package of claim 6, wherein:
the plurality of passive components embedded in the first component embedded structure include capacitors, and
the plurality of passive components embedded in the second component embedded structure include inductors.

9. The fan-out semiconductor package of claim 1, wherein:
the fan-out semiconductor package further comprises a support member having a through-hole,
the semiconductor chip and the component embedded structure are disposed in the through hole,
the encapsulant encapsulates at least portions of the support member,
the connection member is disposed on the support member, and
the support member includes:
a first insulating layer;
a first redistribution layer in contact with the connection member and embedded in a first surface of the first insulating layer; and
a second redistribution layer disposed on a second surface of the first insulating layer opposing the first surface, and
the first redistribution layer and the second redistribution layer are electrically connected to the connection pads of the semiconductor chip.

10. The fan-out semiconductor package of claim 9, wherein:
the support member further includes:
a second insulating layer disposed on the first insulating layer and covering the second redistribution layer; and
a third redistribution layer disposed on the second insulating layer, and
the third redistribution layer is electrically connected to the connection pads of the semiconductor chip.

11. The fan-out semiconductor package of claim 9, wherein a distance between the redistribution layers of the connection member and the first redistribution layer is greater than that between the redistribution layers of the connection member and a connection pad of the connection pads of the semiconductor chip.

12. The fan-out semiconductor package of claim 1, wherein the fan-out semiconductor package further comprises a support member having a through-hole, the semiconductor chip and the component embedded structure are disposed in the through hole, the encapsulant encapsulates at least portions of the support member, the connection member is disposed on the support member, and the support member includes a first insulating layer, a first redistribution layer disposed on a lower surface of the first insulating layer, and a second redistribution layer disposed on an upper surface of the first insulating layer, and the first redistribution layer and the second redistribution layer are electrically connected to the connection pads of the semiconductor chip.

13. The fan-out semiconductor package of claim 12, wherein the support member further includes a second insulating layer disposed on the first insulating layer and covering the first redistribution layer and a third redistribution layer disposed on the second insulating layer, and the third redistribution layer is electrically connected to the connection pads of the semiconductor chip.

14. The fan-out semiconductor package of claim 13, wherein the support member further includes a third insulating layer disposed on the first insulating layer and covering the second redistribution layer and a fourth redistribution layer disposed on the third insulating layer, and the fourth redistribution layer is electrically connected to the connection pads of the semiconductor chip.

15. The fan-out semiconductor package of claim 13, wherein the first insulating layer has a thickness greater than that of the second insulating layer.

* * * * *